(12) United States Patent
Sung et al.

(10) Patent No.: US 10,340,257 B2
(45) Date of Patent: Jul. 2, 2019

(54) DISPLAY DEVICE USING SEMICONDUCTOR LIGHT EMITTING DEVICE AND FABRICATION METHOD THEREOF

(71) Applicant: LG ELECTRONICS INC., Seoul (KR)

(72) Inventors: Junho Sung, Seoul (KR); Minwoo Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/604,593

(22) Filed: May 24, 2017

(65) Prior Publication Data

US 2017/0345802 A1 Nov. 30, 2017

Related U.S. Application Data

(60) Provisional application No. 62/343,834, filed on May 31, 2016.

(30) Foreign Application Priority Data

Jan. 2, 2017 (KR) .................. 10-2017-0000419

(51) Int. Cl.
*H01L 25/075* (2006.01)
*H01L 33/50* (2010.01)
(Continued)

(52) U.S. Cl.
CPC .......... *H01L 25/0753* (2013.01); *H01L 25/50* (2013.01); *H01L 33/38* (2013.01);
(Continued)

(58) Field of Classification Search
CPC ............. H01L 27/3206; H01L 27/3211; H01L 27/3216; H01L 27/3218; H01L 25/0753
See application file for complete search history.

(56) References Cited

U.S. PATENT DOCUMENTS

2009/0179207 A1* 7/2009 Chitnis .................. H01L 33/44
  257/88
2009/0322215 A1* 12/2009 Sung .................. H01L 27/3211
  313/504
(Continued)

FOREIGN PATENT DOCUMENTS

JP  2003158296  5/2003
JP    4935004   5/2012
(Continued)

OTHER PUBLICATIONS

PCT International Application No. PCT/KR2017/005425, Notification of Transmittal of the International Search Report and the Written Opinion of the International Searching Authority, or Declaration dated Sep. 14, 2017, 13 pages.

*Primary Examiner* — Victoria K. Hall
(74) *Attorney, Agent, or Firm* — Lee, Hong, Degerman, Kang & Waimey

(57) ABSTRACT

A display device using a semiconductor light emitting device and a fabrication method thereof is disclosed. A display device includes a plurality of semiconductor light emitting device packages; a wiring substrate coupled to the plurality of semiconductor light emitting device packages; and a plurality of wiring electrodes. A semiconductor light emitting device package includes a plurality of semiconductor light emitting devices; a support substrate coupled to the plurality of semiconductor light emitting devices; and a conversion layer configured to convert a color of light emitted from at least some of the plurality of semiconductor light emitting devices to a different color, forming a red sub-pixel, a green sub-pixel, and a blue sub-pixel. A semiconductor light emitting device corresponding to the red or green sub-pixel and a semiconductor light emitting device (Continued)

corresponding to the blue sub-pixel may have light emitting areas that are of different sizes.

16 Claims, 16 Drawing Sheets

(51) Int. Cl.
    *H01L 33/62*     (2010.01)
    *H01L 25/00*     (2006.01)
    *H01L 33/54*     (2010.01)
    *H01L 33/38*     (2010.01)

(52) U.S. Cl.
    CPC ............ *H01L 33/507* (2013.01); *H01L 33/54* (2013.01); *H01L 33/62* (2013.01); *H01L 2224/95001* (2013.01); *H01L 2933/0016* (2013.01); *H01L 2933/0041* (2013.01)

(56) References Cited

U.S. PATENT DOCUMENTS

| | | | | |
|---|---|---|---|---|
| 2014/0367711 | A1* | 12/2014 | Bibl | ........................ H01L 24/24 |
| | | | | 257/89 |
| 2015/0362165 | A1* | 12/2015 | Chu | .................... H01L 25/0753 |
| | | | | 362/235 |
| 2016/0351539 | A1* | 12/2016 | Bower | ................ H01L 25/0655 |
| 2016/0380158 | A1* | 12/2016 | Sasaki | .................. H01L 33/483 |
| | | | | 257/89 |

FOREIGN PATENT DOCUMENTS

| KR | 1020120038626 | 4/2012 |
|---|---|---|
| KR | 1020150021233 | 3/2015 |
| KR | 1020150104449 | 9/2015 |

* cited by examiner

DISPLAY DEVICE USING SEMICONDUCTOR LIGHT EMITTING DEVICE AND FABRICATION METHOD THEREOF

CROSS-REFERENCE TO RELATED APPLICATIONS

Pursuant to 35 U.S.C. § 119(a), this application claims the benefit of earlier filing date and right of priority to Korean Patent Application No. 10-2017-0000419, filed on Jan. 2, 2017, and pursuant to 35 U.S.C. § 119(e), this application also claims the benefit of U.S. Provisional Application No. 62/343,834, filed on May 31, 2016, the contents of which are all hereby incorporated by reference herein in their entireties.

BACKGROUND OF THE INVENTION

1. Field of the Invention

The present disclosure relates to a display device and a fabrication method thereof, and more particularly, to a display device using a semiconductor light emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs). However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

In case of using a package in which a semiconductor light emitting device is integrated in a die form, there is a disadvantage in that it is not suitable for a small-sized or high-resolution display field because the pixel has a size on the order of millimeters due to the limit of a chip size and a package size.

Therefore, studies on a technical field of applying a semiconductor light emitting device itself to a display have been carried out. However, since a size of individual light emitting devices is less than several tens of micrometers, it is very difficult to handle and integrate these devices with conventional technologies to implement a target display, and thus has a disadvantage in that the process yield becomes very low.

Accordingly, the present disclosure proposes a new structure of a display device capable of implementing a large-sized display at a low cost based on a semiconductor light emitting device having a size of several to several tens of micrometers.

SUMMARY OF THE INVENTION

The present disclosure provides a new structure of a display device capable of facilitating fabrication as well as supporting high resolution, and a fabrication method thereof. The present disclosure further provides a display device suitable for arrangement and mass production of semiconductor light emitting devices, and a fabrication method thereof.

A display device according to the present disclosure may divide ultra-small semiconductor light emitting devices implemented on a wafer in units of pixels, and have different red, green and blue light emitting areas within a pixel to implement high resolution.

In one aspect, the display device may include a plurality of semiconductor light emitting device packages, a wiring substrate coupled to the plurality of semiconductor light emitting device packages, and a plurality of wiring electrodes disposed on the wiring substrate, wherein each of the plurality of semiconductor light emitting device packages includes a plurality of semiconductor light emitting devices, a support substrate coupled to the plurality of semiconductor light emitting devices, and a conversion layer disposed to cover the plurality of semiconductor light emitting devices and configured to convert a color of light emitted from at least some of the plurality of semiconductor light emitting devices to a different color such that a red sub-pixel, a green sub-pixel, and a blue sub-pixel are formed, and wherein at least a first semiconductor light emitting device that corresponds to the red sub-pixel or a second semiconductor light emitting device that corresponds to the green sub-pixel, among the plurality of semiconductor light emitting devices, has a light emitting area that has a different size compared to a size of a light emitting area of a third semiconductor light emitting device that corresponds to the blue sub-pixel among the plurality of semiconductor light emitting devices.

According to an embodiment, the plurality of semiconductor light emitting devices may include a first semiconductor light emitting device, a second semiconductor light emitting device, and a third semiconductor light emitting device that are coupled to the support substrate to form one semiconductor light emitting device package.

The first semiconductor light emitting device disposed at the red sub-pixel, the second semiconductor light emitting device disposed at the green sub-pixel, and the third semiconductor light emitting device disposed at the blue sub-pixel may have different sizes.

The support substrate may be provided with a first region corresponding to the first semiconductor light emitting device, a second region corresponding to the second semiconductor light emitting device, and a third region corresponding to the third semiconductor light emitting device; and the first region, the second region, and the third region are different from one another in their sizes.

According to an embodiment, a first conductive semiconductor layer of one of the plurality of semiconductor light emitting devices may have a shape that is different from a shape of another first conductive semiconductor layer of another one of the plurality of semiconductor light emitting devices. A first conductive semiconductor layer of a semiconductor light emitting device corresponding to the red sub-pixel may be formed in a shape of extending in both directions that are perpendicular to each other.

According to an embodiment, a second conductive semiconductor layer of one of the plurality of semiconductor light emitting devices may have a different upper surface area compared to an upper surface area of another second conductive semiconductor layer of another one of the plurality of semiconductor light emitting devices.

According to an embodiment, the display device may further include a common electrode connected to a corresponding first conductive electrode of the plurality of semiconductor light emitting devices, wherein the common electrode is formed on the support substrate.

The display device may further include a common electrode connected to a corresponding first conductive electrodes of the plurality of semiconductor light emitting devices, and wherein the common electrode may be formed on the support substrate. The through silicon vias may be provided with one through electrode connected to the common electrode and a plurality of through electrodes connected to corresponding second conductive electrodes of the plurality of semiconductor light emitting devices.

Furthermore, the present disclosure discloses a semiconductor light emitting device package including a plurality of semiconductor light emitting devices, a support substrate coupled to the plurality of semiconductor light emitting devices, and a conversion layer disposed to cover the plurality of semiconductor light emitting devices and configured to convert a color of light emitted from at least some of the plurality of semiconductor light emitting devices to a different color such that a red sub-pixel, a green sub-pixel, and a blue sub-pixel are formed, wherein at least a first semiconductor light emitting device that corresponds to the red sub-pixel or a second semiconductor light emitting device that corresponds to the green sub-pixel, among the plurality of semiconductor light emitting devices, has a light emitting area that has a different size compared to a size of a light emitting area of a third semiconductor light emitting device that corresponds to the blue sub-pixel among the plurality of semiconductor light emitting devices.

In addition, the present disclosure discloses a method for fabricating a display device that includes sequentially growing an n-type semiconductor layer, an active layer and a p-type semiconductor layer on a growth substrate; etching the p-type semiconductor layer, the active layer, and the n-type semiconductor layer to form a plurality of semiconductor light emitting devices on the growth substrate; forming an electrode on the plurality of semiconductor light emitting devices; forming an insulating layer for filling between the plurality of semiconductor light emitting devices on one surface of the growth substrate; coupling the plurality of semiconductor light emitting devices to a support substrate, and removing the growth substrate; and forming a conversion layer for converting a color of light emitted from at least some of the plurality of semiconductor light emitting devices to a different color, wherein at least one of the plurality of semiconductor light emitting devices formed on the growth substrate has a light emitting area that has a different size compared to a size of a light emitting area of another one of the plurality of semiconductor light emitting devices.

In a display device according to the present disclosure, the light emitting areas of red, green, and blue sub-pixels may be different from one another, thereby controlling a drive current of each sub-pixel in the same manner.

In a display device according to the present disclosure, red, green, and blue sub-pixels may be implemented on a wafer to divide them in the unit of pixels through a dicing process or the like. In addition, according to the present disclosure, a one-to-one transfer may be implemented at a wafer level using a support substrate having a through silicon via.

According to the present disclosure, most of the process may be implemented on a wafer, thereby allowing a high yield and a batch process as well as fabricating a display device with high precision. Moreover, a silicon substrate may be used, thereby reducing the fabrication cost.

According to the present disclosure, the divided pixels may form a unit substrate, and a size of the unit substrate may be very small, which is very suitable for reducing the pixel interval of a large-sized display such as signage. In this case, the unit substrate may be larger than individual semiconductor light emitting devices, thereby facilitating fabrication compared to a case of picking and placing the semiconductor light emitting devices.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
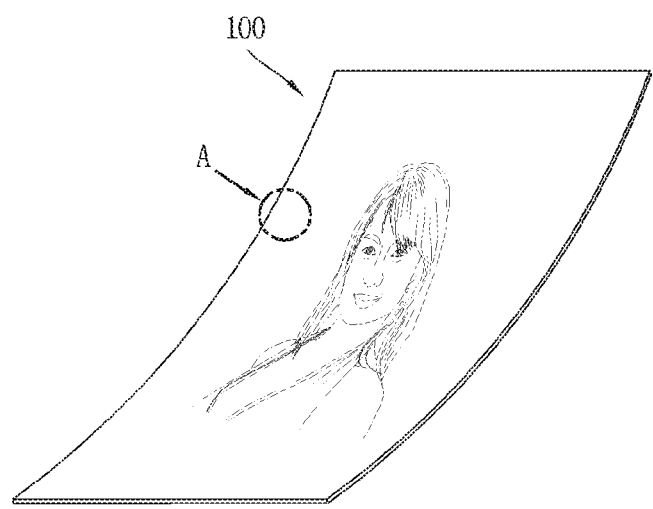
FIG. 1 is a conceptual view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. In describing the embodiments disclosed herein, moreover, the detailed description will be omitted when a specific description for publicly known technologies to which the invention pertains is judged to obscure the gist of the present invention. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the present disclosure, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
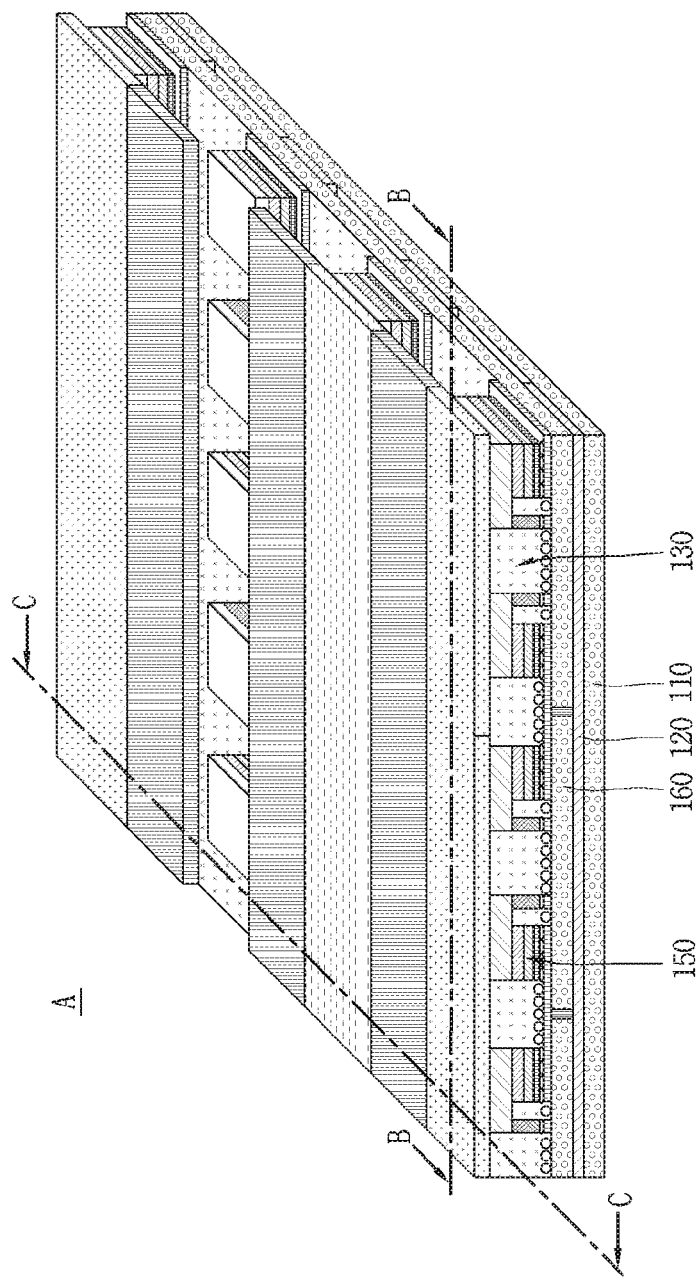
FIG. 2 is a partial enlarged view of portion "A" in FIG. 1.
Figure 3A:
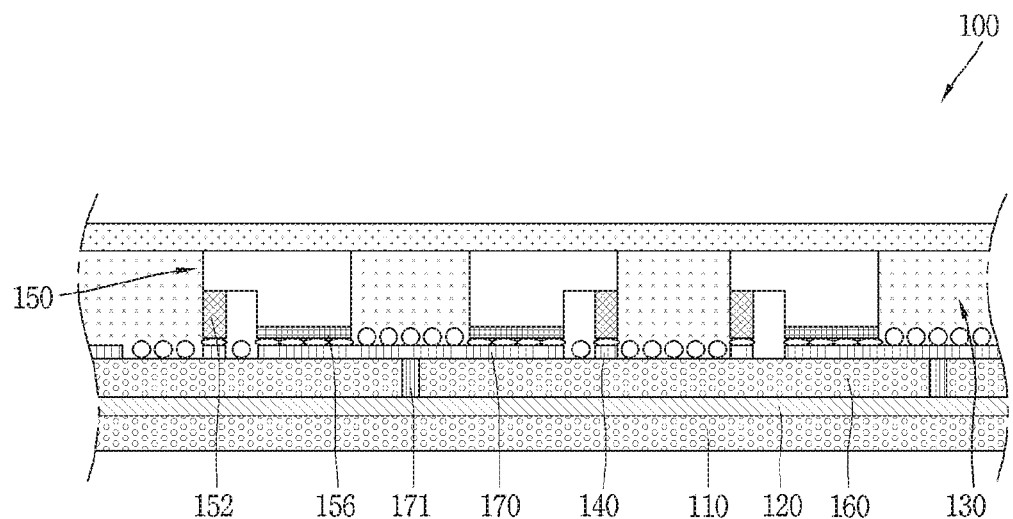
FIGS. 3A and 3B are cross-sectional views taken along lines B-B and C-C in FIG. 2.
Figure 3B:
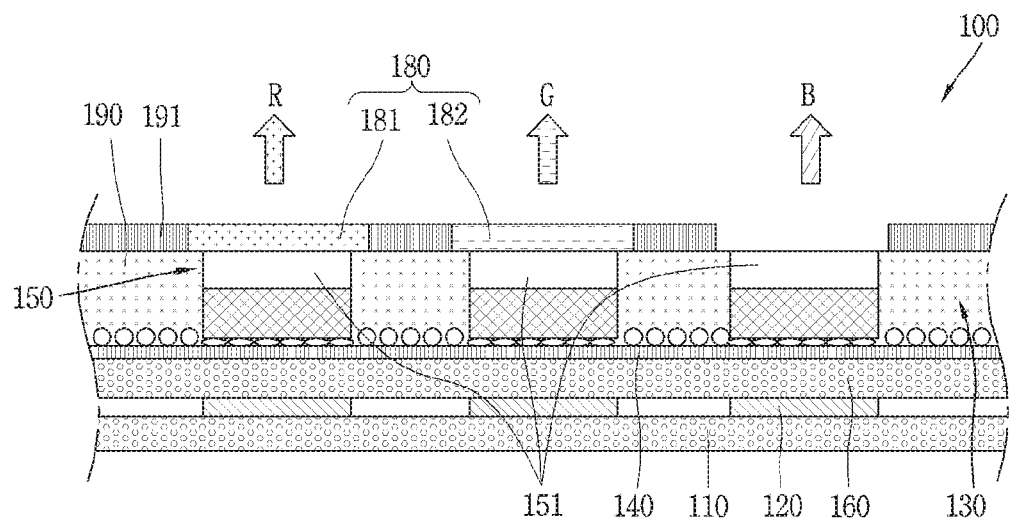
Figure 4:
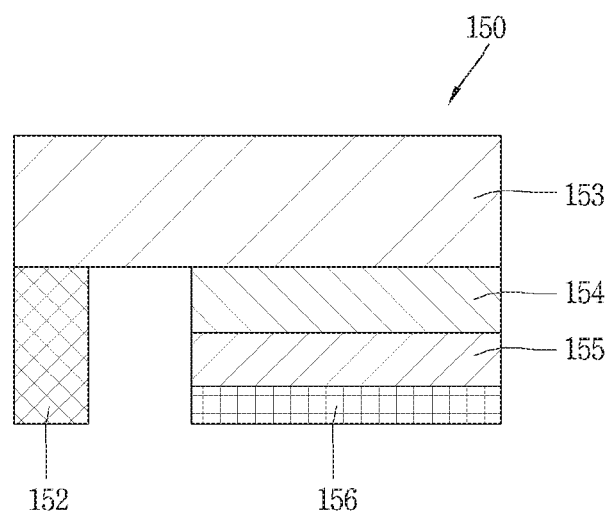
FIG. 4 is a conceptual view illustrating a flip-chip type semiconductor light emitting device in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

According to the drawings in FIGS. 2, 3A and 3B, there is illustrated a display device 100 using a passive matrix (PM) type semiconductor light emitting device as a display device 100 using a semiconductor light emitting device. However, the following illustration may be also applicable to an active matrix (AM) type semiconductor light emitting device.

The display device 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present embodiment, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connected thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the auxiliary electrode 170 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device. As described above, the conductive adhesive layer 130 may form an electrical connection as well as allow a mutual coupling between the semiconductor light emitting device 150 and the auxiliary electrode 170 and between the semiconductor light emitting device 150 and the second electrode 140.

Furthermore, a plurality of semiconductor light emitting devices 150 constitute a light-emitting array, and a phosphor layer 180 is formed on the light-emitting array.

The light emitting device array may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices grown on a transparent dielectric substrate. Furthermore, the semiconductor light emitting devices may be nitride semiconductor light emitting devices, for instance. The semiconductor light emitting device 150 has an excellent luminance characteristic, and thus it may be possible to configure individual sub-pixels even with a small size thereof.

According to the drawing, a partition wall 190 may be formed between the semiconductor light emitting devices 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. It may have an effect of enhancing reflectivity when the partition wall of the white insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the present disclosure may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
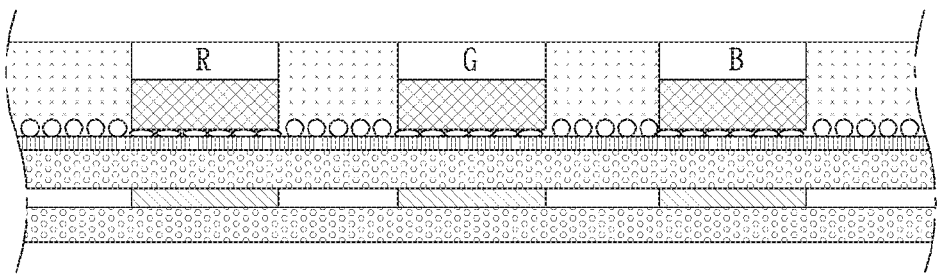
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this case, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
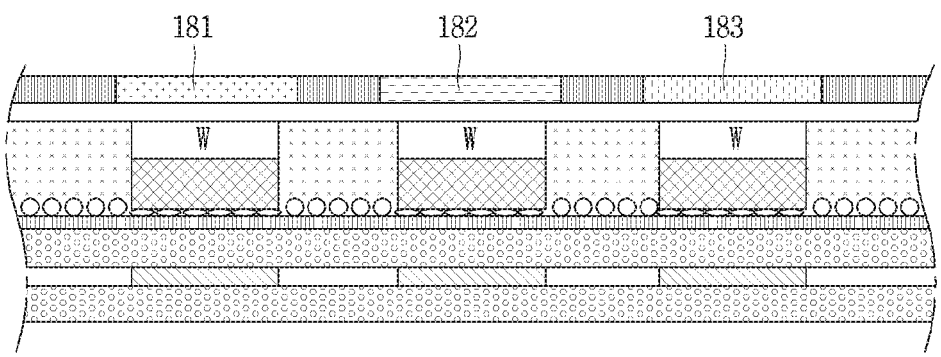

Referring to FIG. 5B, the semiconductor light emitting device may have a white light emitting device (W) provided with a yellow phosphor layer for each element. In this case, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
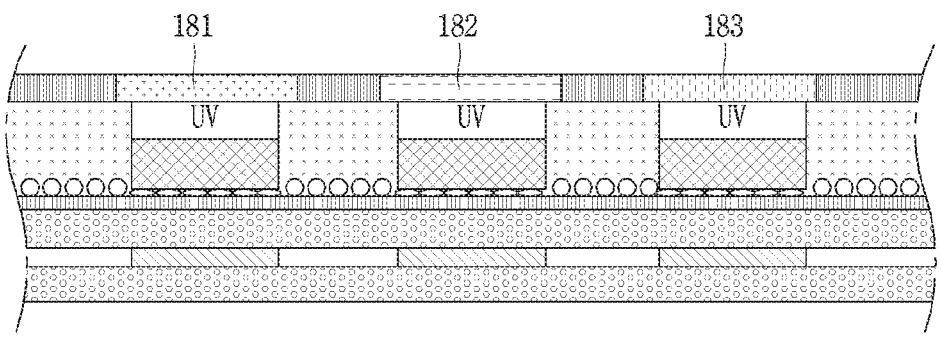

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 may have excellent luminance characteristics, and thus it may be possible to configure individual sub-pixels even with a small size thereof. The size of the individual semiconductor light emitting device 150 may be less than 80 µm in the length of one side thereof, and formed with a rectangular or square shaped element. In case of a rectangular shaped element, the size thereof may be less than 20×80 µm.

Furthermore, even when a square shaped semiconductor light emitting device 150 with a length of side of 10 µm is used for a sub-pixel, it will exhibit a sufficient brightness for implementing a display device. Accordingly, for example, in case of a rectangular pixel in which one side of a sub-pixel is 600 µm in size, and the remaining one side thereof is 300 µm, a relative distance between the semiconductor light emitting devices becomes sufficiently large. Accordingly, in this case, it may be possible to implement a flexible display device having a HD image quality.

A display device using the foregoing semiconductor light emitting device will be fabricated by a new type of fabrication method. Hereinafter, the fabrication method will be described with reference to FIG. 6.

Figure 6:
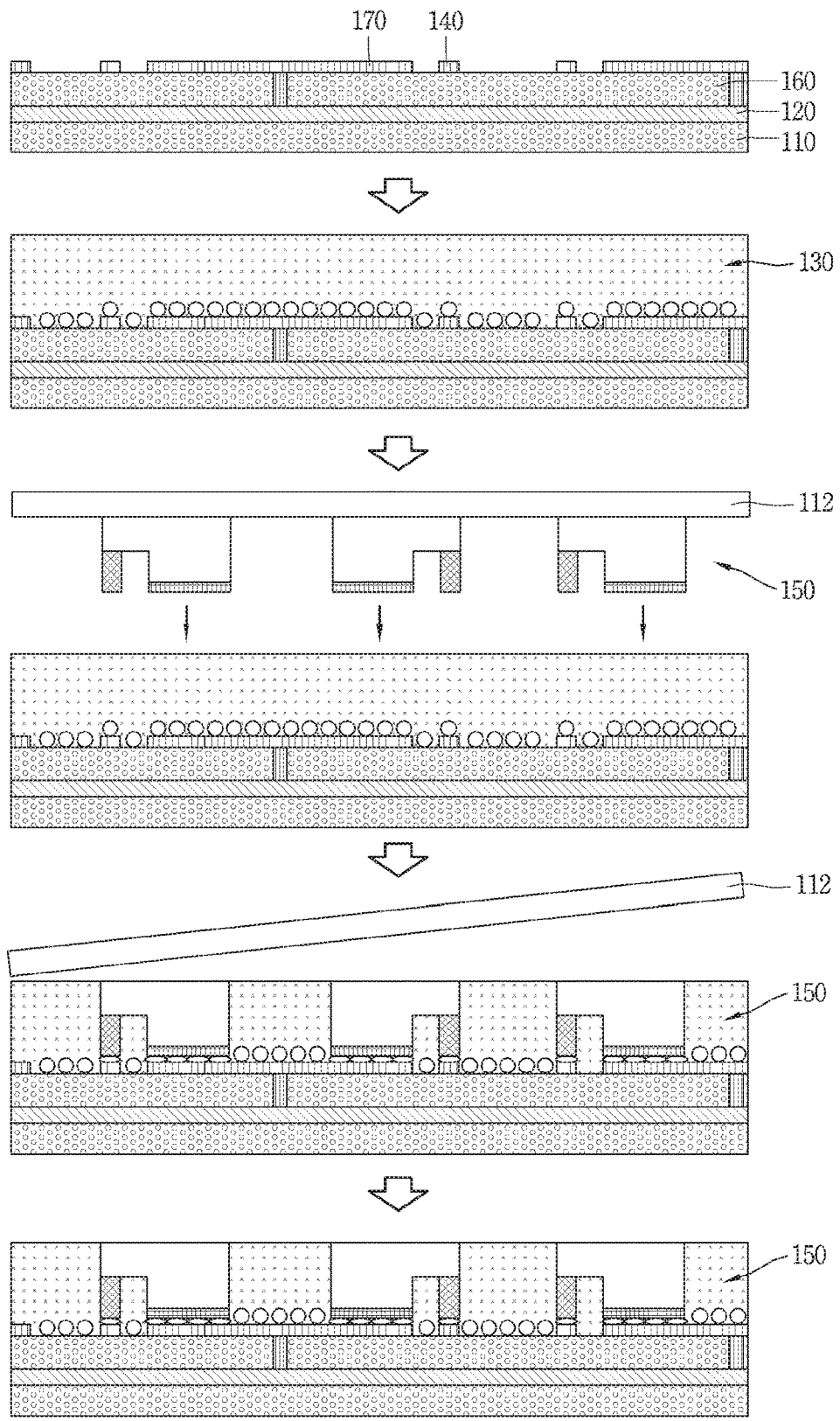
FIG. 6 is cross-sectional views illustrating a fabrication method of a display device using a semiconductor light emitting device according to the present disclosure.

FIG. 6 is cross-sectional views illustrating a method of fabricating a display device using a semiconductor light emitting device according to an embodiment of the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate) and the first electrode 120, and then auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this case, the second substrate 112 as a growth substrate for growing the semiconductor light emitting device 150 may be a sapphire substrate or silicon substrate.

The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer (not shown).

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For such an example, the foregoing display device may be applicable to a vertical semiconductor light emitting device. Hereinafter, the vertical structure will be described with reference to FIGS. 7-9.

Furthermore, according to the following modified example or embodiment, the same or similar reference numerals are designated to the same or similar configurations to the foregoing example, and the description thereof will be substituted by the earlier description.

Figure 7:
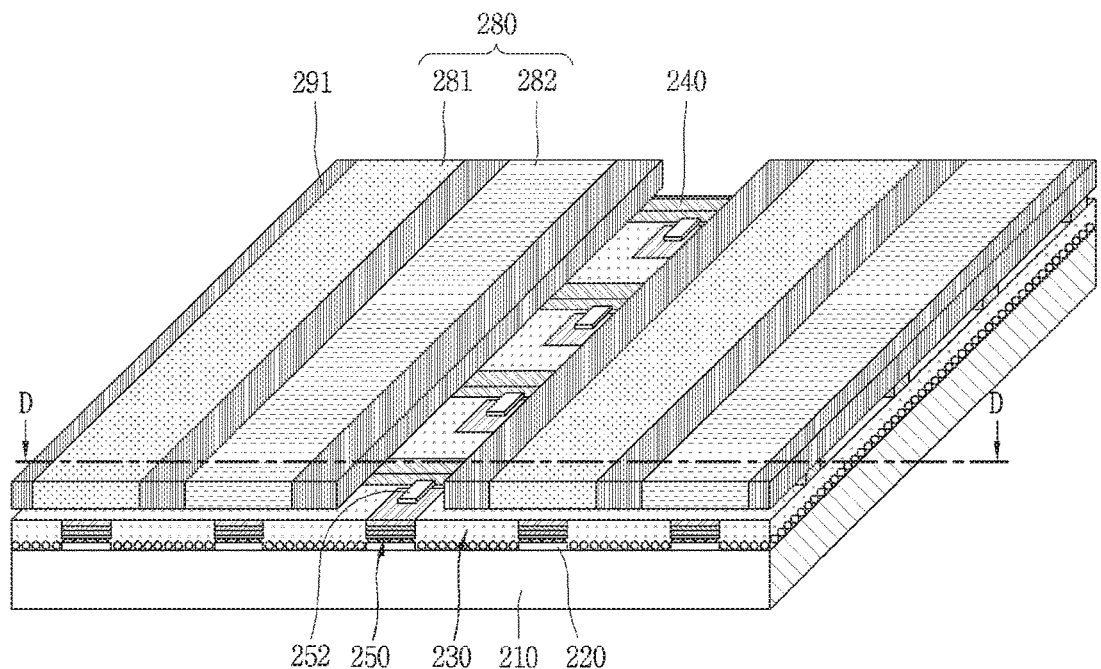
FIG. 7 is a perspective view illustrating a display device using a semiconductor light emitting device according to another embodiment of the present disclosure.
Figure 8:
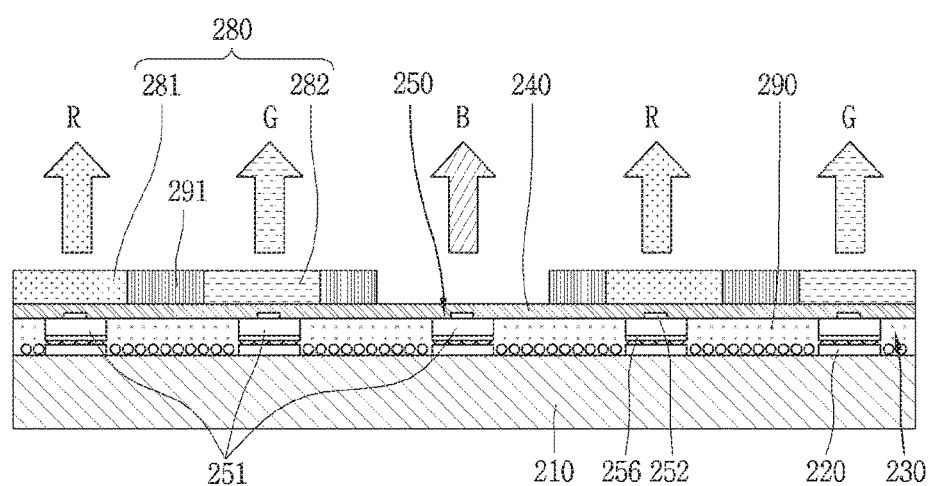
FIG. 8 is a cross-sectional view taken along line D-D in FIG. 7.
Figure 9:
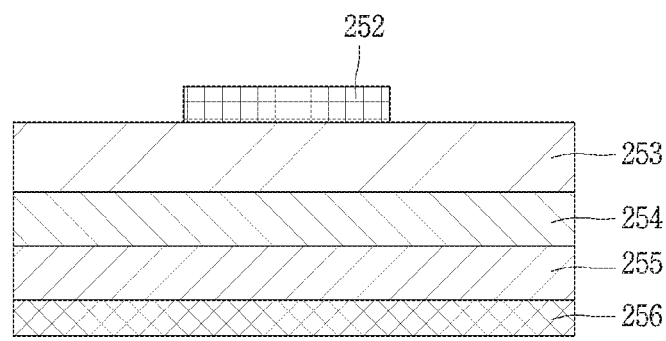
FIG. 9 is a conceptual view illustrating a vertical type semiconductor light emitting device in FIG. 8.

FIG. 7 is a perspective view illustrating a display device using a semiconductor light emitting device according to another embodiment of the present disclosure. FIG. 8 is a cross-sectional view taken along line C-C in FIG. 7, and FIG. 9 is a conceptual view illustrating a vertical type semiconductor light emitting device in FIG. 8.

According to the drawings, the display device may be a display device using a passive matrix (PM) type of vertical semiconductor light emitting device.

The display device may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display device. The semiconductor light emitting device 250 may have excellent luminance characteristics, and thus it may be possible to configure individual sub-pixels even with a small size thereof. The size of the individual semiconductor light emitting device 250 may be less than 80 μm in the length of one side thereof, and formed with a rectangular or square shaped element. In case of a rectangular shaped element, the size thereof may be less than 20×80 μm.

The semiconductor light emitting device 250 may be a vertical structure.

A plurality of second electrodes 240 disposed in a direction of crossing the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring again to FIG. 8, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with a bar-shaped electrode elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to examples shown in the drawing, the second electrode 240 may be located on the conductive adhesive layer 230. According to circumstances, a transparent insulating layer (not shown) containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, the semiconductor light emitting device 250 may form individual sub-pixels despite a small size thereof. As a result, it may be possible to implement a full color display in which the sub-pixels of red (R), green (G) and blue (B) implement one pixel by means of the semiconductor light emitting device.

In a display using the foregoing semiconductor light emitting device of the present disclosure, a semiconductor light emitting device grown on a growth substrate is transferred to a wiring substrate using an anisotropic conductive film (ACF). However, such a method has a disadvantage in that it is difficult to secure fabrication reliability and its fabrication cost is high. In particular, in a case of digital signage, the property of flexibility may not be required, and thus a different approach may be required for a display using a semiconductor light emitting device.

Hereinafter, in order to overcome the foregoing technical difficulties and implement a high-resolution display based on an ultra-small micro light emitting diode, the present disclosure proposes a pixel structure for a display based on an ultra-small blue light emitting diode and a fabrication method thereof.

More specifically, the present disclosure presents a structure in which an ultra-small blue semiconductor light emitting device transferred onto a support substrate forms a sub-pixel (unit pixel), and a conversion layer for converting color is layered to form one semiconductor light emitting device package, and a method of equalizing a drive current using the same.

Hereinafter, a display device according to another embodiment of the present disclosure using a semiconductor light emitting device package will be described in detail with reference to the drawings.

Figure 10:
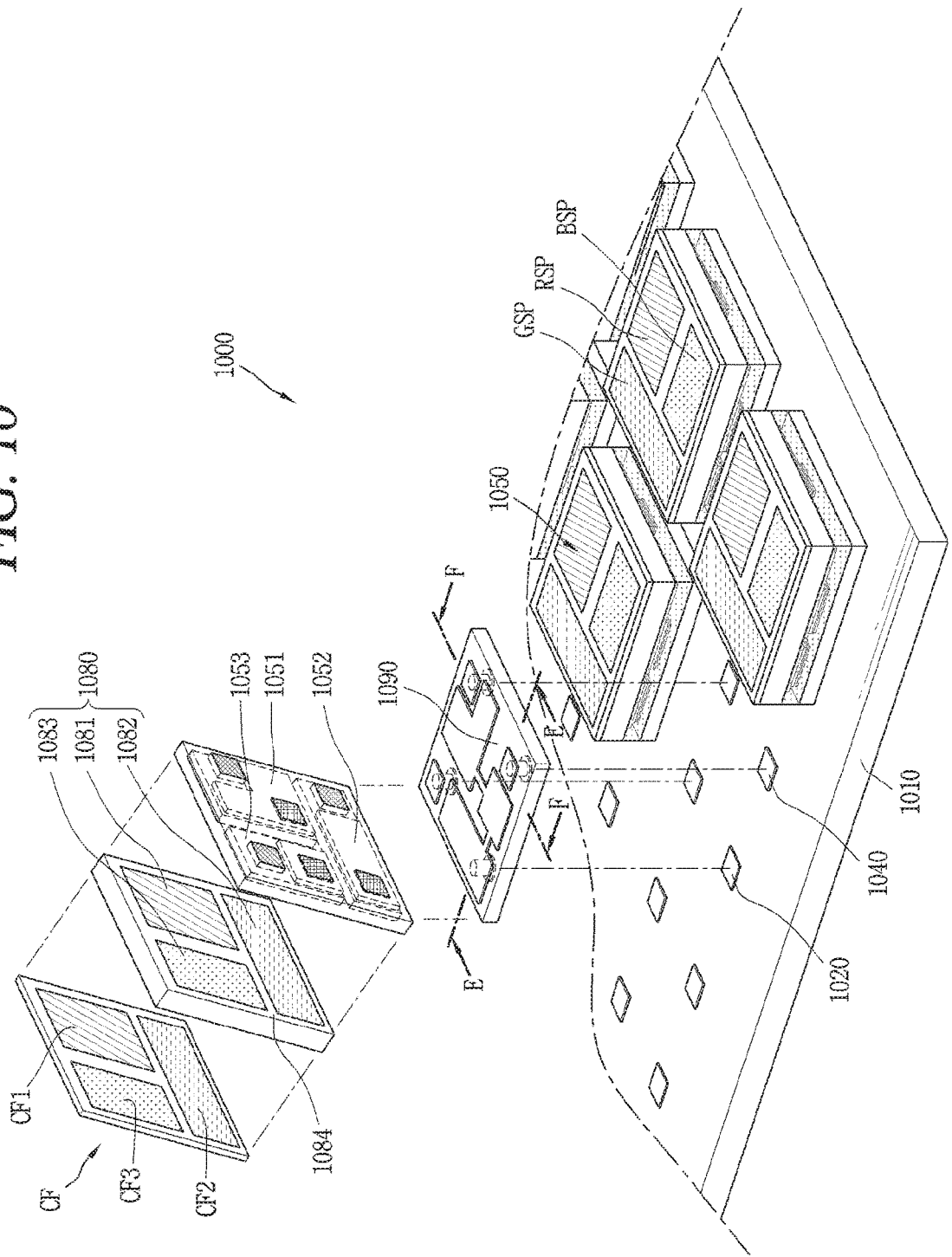
FIG. 10 is a partial perspective view for explaining another embodiment of the present disclosure.
Figure 11:
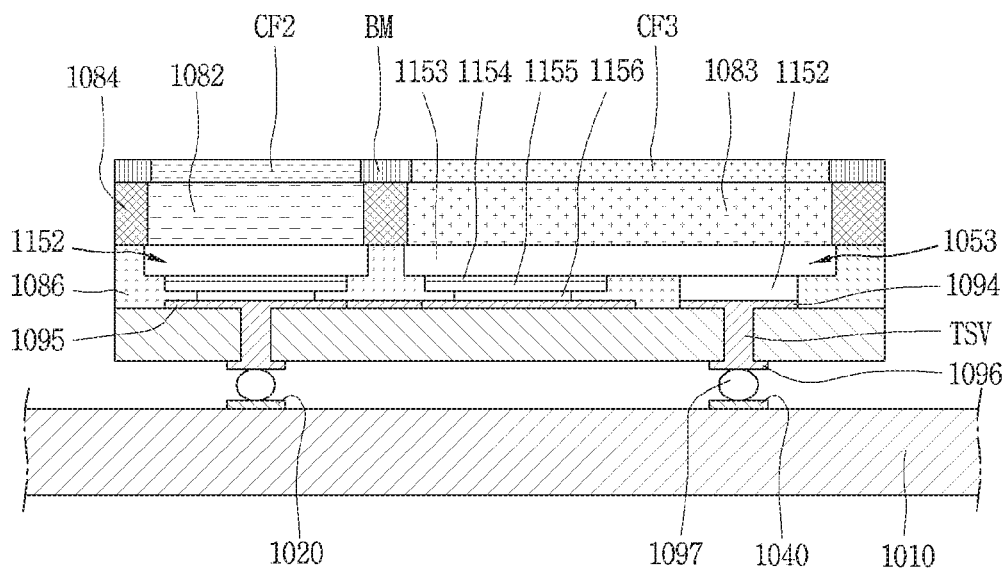
FIG. 11 is a cross-sectional view taken along line E-E in FIG. 10.
Figure 12:
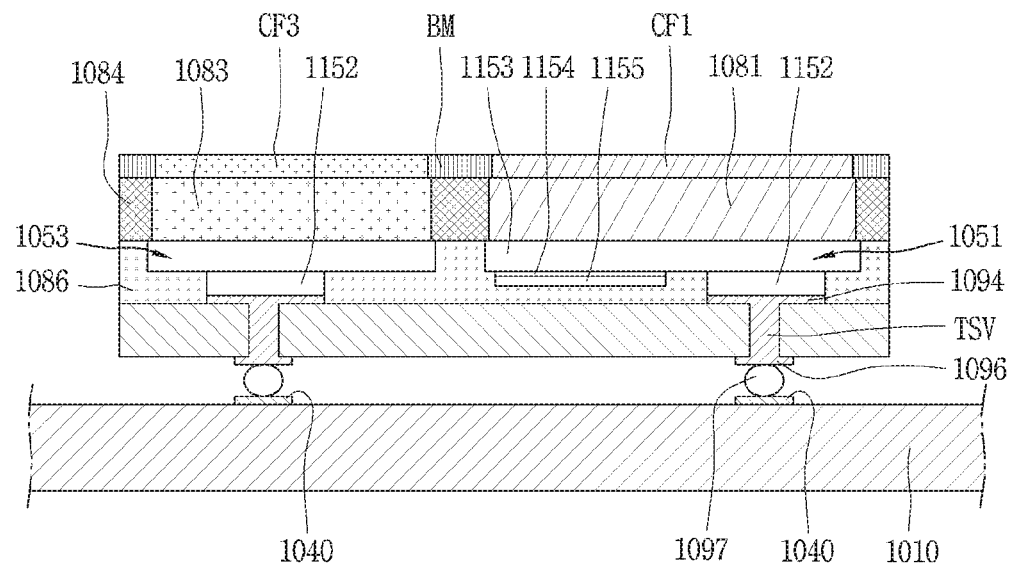
FIG. 12 is a cross-sectional view taken along line F-F in FIG. 10.
Figure 13:
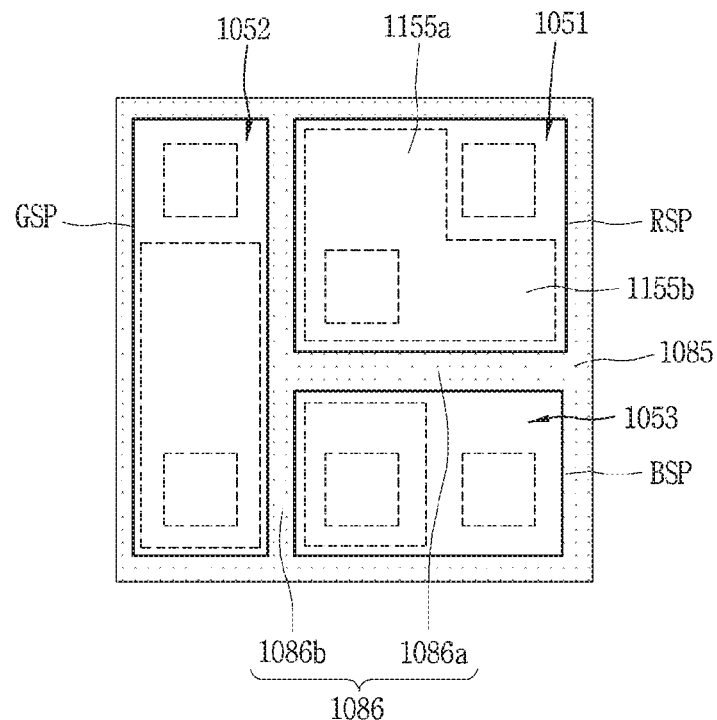
FIG. 13 is a plan view illustrating a semiconductor light emitting device package of the present disclosure.
Figure 14:
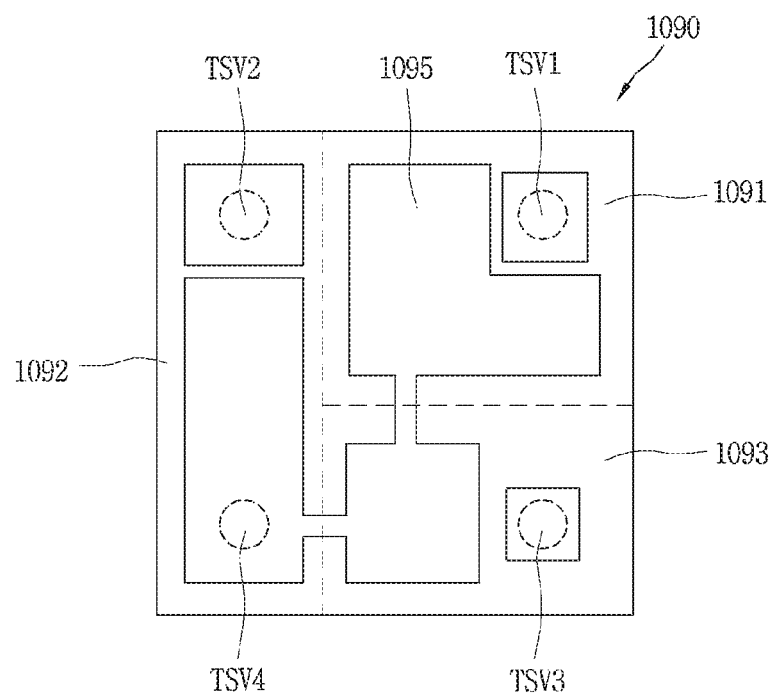
FIG. 14 is a plan view of a support substrate.

FIG. 10 is a partial perspective view for explaining another embodiment of the present disclosure, and FIG. 11 is a cross-sectional view taken along line E-E in FIG. 10, and FIG. 12 is a cross-sectional view taken along line F-F in FIG. 10, and FIG. 13 is a plan view illustrating a semiconductor light emitting device package of the present disclosure, and FIG. 14 is a plan view of a support substrate.

According to the illustrations of FIGS. 10, 11, 12, 13 and 14, a display device 1000 using a semiconductor light emitting device is illustrated as a display device 1000 using a passive matrix (PM) type semiconductor light emitting device. However, an example described below may also be applicable to an active matrix (AM) type semiconductor light emitting device.

The display device 1000 includes a substrate 1010 and a plurality of semiconductor light emitting device packages 1050.

The substrate 1010 may be a wiring substrate disposed with a first electrode 1020 and a second electrode 1040. Accordingly, the first electrode 1020 and the second electrode 1040 may be positioned on the substrate 1010. Here, the first electrode 1020 and the second electrode 1040 may be wiring electrodes.

The substrate 1010 may be formed of an insulating but non-flexible material. In addition, the substrate 1010 may be formed of a transparent material or non-transparent material.

Referring to these drawings, a semiconductor light emitting device package 1050 is coupled to one surface of the substrate 1010. For example, an electrode of the semiconductor light emitting device package 1050 may be coupled to a wiring electrode by soldering or the like. In this case, the conductive adhesive layer described in the foregoing embodiment may be excluded.

The plurality of semiconductor light emitting device packages 1050 are cut on a wafer in the unit of pixels, and one semiconductor light emitting device package 1050 may include a plurality of semiconductor light emitting devices, 1051, 1052, 1053, a conversion layer 1080 and a support substrate 1090.

Each of the plurality of semiconductor light emitting devices 1051, 1052, 1053 may be mostly formed of gallium nitride (GaN), and indium (In) and/or aluminum (Al) may be added thereto to implement a high-power light emitting device that emits blue light.

For such an example, the plurality of semiconductor light emitting devices 1050 may be gallium nitride thin layers formed with various layers, such as n-Gan, p-Gan, AlGaN, InGan, and the like. However, the present disclosure may not be necessarily limited thereto, and the plurality of semiconductor light emitting devices may be implemented as light emitting devices that emit green light.

For a more specific example, the semiconductor light emitting device 1050 may be a flip-chip type light emitting device. The semiconductor light emitting device 1050 includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 disposed to be spaced apart from the first conductive electrode 1156 in a horizontal direction on the second conductive semiconductor layer 1153. In this case, the first conductive electrode 1156 and the first conductive semiconductor layer 1155 may be a p-type electrode and a p-type semiconductor layer, and the second conductive electrode 1152 and the second conductive semiconductor layer 1153 may be an n-type electrode and an n-type semiconductor layer. In addition, the active layer 1154 may be formed between the p-type semiconductor layer and the n-type semiconductor layer.

According to the illustration, the plurality of semiconductor light emitting devices 1051, 1052, 1053 are three sub-pixels, which are combined to constitute one RGB pixel. In other words, the plurality of semiconductor light emitting devices 1051, 1052, 1053 form a red sub-pixel (RSP), a green sub-pixel (GSP), and a blue sub-pixel (BSP), respectively. In this case, the semiconductor light emitting devices 1051, 1052 corresponding to at least one of the red sub-pixel (RSP) and the green sub-pixel (GSP) may have a different light emitting area from that of the semiconductor light emitting device 1053 corresponding to the blue sub-pixel (BSP).

For example, the plurality of semiconductor light emitting devices may include a first semiconductor light emitting device 1051, a second semiconductor light emitting device 1052, and a third semiconductor light emitting device 1053 coupled to the support substrate 1090 to form one semiconductor light emitting device package 1050. Only the first semiconductor light emitting device 1051, the second semiconductor light emitting device 1052, and the third semiconductor light emitting device 1053 are provided in one package, and they may be blue light emitting devices having different light emitting areas.

More specifically, the first semiconductor light emitting device 1051, the second semiconductor light emitting device 1052, and the third semiconductor light emitting device 1053 are formed in different sizes, and disposed at the red sub-pixel (RSP), the green sub-pixel (GSP) and the blue sub-pixel (BSP), respectively. For such an example, the n-type semiconductor layer of any one semiconductor light emitting device may have a different upper surface area from that of the n-type semiconductor layer of the other semiconductor light emitting device. The upper surface as a surface farthest from the wiring substrate may be an exit surface through which light is emitted from the semiconductor light emitting device. In other words, though the n-type semiconductor layers are respectively formed in a rectangular parallelepiped shape, the first semiconductor light emitting device 1051, the second semiconductor light emitting device 1052, and the third semiconductor light emitting device 1053 have upper and lower surfaces with different areas.

However, an undoped semiconductor layer may be formed on an upper surface of the n-type semiconductor layer, and in this case, a top surface farthest from the wiring substrate in the undoped semiconductor layer may be an exit surface that emits light. Moreover, fine grooves may be formed by roughing on the top surface of the undoped semiconductor layer.

In addition, according to the illustration, any one p-type semiconductor layer of the plurality of semiconductor light emitting devices 1051, 1052, 1053 may have a different shape from that of the other p-type semiconductor layer thereof. For such an example, the second semiconductor light emitting device 1052 and the third semiconductor light emitting device 1053 are respectively formed in a rectangular parallelepiped shape, but the first semiconductor light emitting device 1051 may have a different shape. In this case, the second semiconductor light emitting device 1052 and the third semiconductor light emitting device 1053 may have different areas on the upper and lower surfaces, respectively.

The p-type semiconductor layer of the semiconductor light emitting device corresponding to the green sub-pixel (GSP) has a larger area than the p-type semiconductor layer of the semiconductor light emitting device corresponding to the blue sub-pixel (BSP). The p-type semiconductor layer of the semiconductor light emitting device corresponding to the red sub-pixel (RSP) has a shape extended in both directions perpendicular to each other. For example, the p-type semiconductor layer may be formed in a shape in which two rectangular parallelepipeds are integrated. Specifically, the p-type semiconductor layer of the first semiconductor light emitting device 1051 may include a base portion 1155a extended in parallel to the p-type semiconductor layer of the second semiconductor light emitting device 1052, and a protruding portion 1155b protruded in a direction perpendicular to the p-type semiconductor layer of the second semiconductor light emitting device from the base portion 1155a. Therefore, an area of the p-type semiconductor layer of the first semiconductor light emitting device 1051 may be the largest.

Since the p-type semiconductor layer has the foregoing shape, the active layer 1154 overlapping with the p-type semiconductor layer may have a large area in the order of the first semiconductor light emitting device 1051, the second semiconductor light emitting device 1052, and the third semiconductor light emitting device 1053. Through this, the first semiconductor light emitting device 1051, the second semiconductor light emitting device 1052, and the third semiconductor light emitting device 1053 may have different light emitting areas.

However, the present disclosure is not necessarily limited to the structure described above. For example, in order to vary the light emitting area, it may also be possible to have a structure in which a length of each sub-pixel is the same in one direction but a width thereof is different in the other direction perpendicular to the one direction. In this case, a width of the red sub-pixel (RSP) is the largest, and a width of the green sub-pixel (GSP) is the second largest, and a width of the blue sub-pixel (BSP) is the smallest. Correspondingly, the width thereof may decrease in the order of the first semiconductor light emitting device 1051, the second semiconductor light emitting device 1052 and the third semiconductor light emitting device 1053.

As described above, in this example, since a red light emitting area having a low light efficiency is the largest, an amount of red light is sufficient even if a drive current of each sub-pixel is the same. In the case of green light in which the efficiency is better than that of red, but lower than that of blue, a sufficient amount of light may be secured even when the drive current is the same as that of the blue pixel. Since the conversion layer and the blue semiconductor light emitting device are used in this example, the light efficiency may vary at each sub-pixel.

As described above, the semiconductor light emitting device package 1050 may include a conversion layer 1080 disposed to cover a plurality of semiconductor light emitting devices 1051, 1052, 1053. For example, the semiconductor light emitting devices are blue semiconductor light emitting devices for emitting blue (B) light, and the conversion layer 1080 has a function of converting the blue (B) light into a color such as yellow, white, red, green or the like. At this time, colors to be converted at the respective pixels may be different from each other. For such an example, it is possible to convert blue light into yellow light at a green pixel, and convert blue light into a wavelength in which red and yellow are mixed at a red pixel.

According to the illustration, the conversion layer 1080 includes a plurality of phosphor portions 1081, 1082 that convert a wavelength of light. In this case, a partition wall 1084 may be formed between the plurality of phosphor portions 1081, 1082.

For example, the plurality of phosphor portions 1081, 1082 may include a first phosphor portion 1081 disposed at a position corresponding to a red pixel and a second phosphor portion 1082 disposed at a position corresponding to a green pixel. In this case, each of the first phosphor portion 1081 and the second phosphor portion 1082 is provided with a red phosphor and a green phosphor capable of converting the blue light of the blue semiconductor light emitting devices 1051, 1052 into red light or green light. Here, a light transmitting material 1083 that does not convert color may be disposed at a position forming a blue pixel. The light transmitting material 1083 is a material having a high transmittance in a visible light region, and an epoxy-based PR (photoresist), PDMS (polydimethylsiloxane), resin or the like may be used, for example.

For another example, the first phosphor portion 1081 and the second phosphor portion 1082 may be provided with a yellow phosphor capable of converting the blue light of the blue semiconductor light emitting device 1051, 1052 into yellow light or white light. In this case, yellow light or white light may be converted into red, green and blue while passing through a color filter.

On the other hand, the plurality of phosphor portions 1081, 1082 may be partitioned by a partition wall 1084. To this end, the plurality of semiconductor light emitting device packages may include partition walls 1084, respectively. The partition wall 1084 may perform the role of dividing individual sub-pixels from each other, and may be disposed between the semiconductor light emitting devices.

Furthermore, the partition wall 1084 may include a photoresist, an optical polymer material, and other industrial plastic materials, and the like. Furthermore, a reflective partition wall may be additionally provided as the partition wall 1084. In this case, the partition wall 1084 may include black or white insulators depending on the purpose of a display device. When a partition wall of a white insulator is used, an effect of enhancing reflectivity may be obtained.

When a partition wall of a black insulator is used, a contrast ratio may be increased while having a reflection characteristic.

Furthermore, a reflective layer structure for enhancing the reflection characteristic may be introduced on the partition wall 1084. In other words, reflective layers having various structures such as metal and dielectric thin layers may be disposed at both side edges of the partition wall 1084.

For the structure in which individual sub-pixels are separated from each other as unit pixels, and these are combined to form one pixel, and the pixels are mounted on a wiring substrate as one package, the partition wall 1084 is provided with an edge portion 1085 and a partition portion 1086. The edge portion 1085 is formed along an edge of each of the packages, and the partition portion 1086 is protruded from the edge portion 1085 to partition between the red sub-pixel, the green sub-pixel, and the blue sub-pixel.

According to the illustration, the semiconductor light emitting device package has a rectangular plane and is divided into three regions having different areas by the partition wall. The three regions are regions corresponding to the respective sub-pixels, and the partition portion 1086 may include a first portion 1086*a* and a second portion 1086*b* in order to vary their areas.

For example, the first portion 1086*a* extends in one direction, and the second portion 1086*b* is protruded from the first portion 1086*a* in the other direction perpendicular to the one direction. Specifically, the second portion 1086*b* is disposed between the first semiconductor light emitting device 1051 and the third semiconductor light emitting device 1053, and the second semiconductor light emitting device 1052. The first portion 1086*a* is protruded from the second portion 1086*b* in a direction perpendicular to the second portion 1086*b* to divide the first semiconductor light emitting device 1051 and the third semiconductor light emitting device 1053. Through such a structure, in a compact space, each of a plurality of phosphor portions 1081, 1082 and a portion filled with a light transmitting material corresponding to blue may have a different area.

According to the illustration, a color filter (CF) is disposed to cover the conversion layer 1080. More specifically, the color filter (CF) and the wavelength conversion layer 1080 may be combined by an adhesive layer (not shown). For example, as the adhesive layer is disposed between the color filter (CF) and the conversion layer 1080, the color filter (CF) may be adhered to the conversion layer 1080.

In this case, the color filter (CF) is configured to selectively transmit light to implement red, green and blue colors. The color filter (CF) may be provided with respective portions for filtering a red wavelength, a green wavelength, and a blue wavelength, and each of the portions to have a structure in which the respective portions are repeatedly arranged. Here, a portion (CF1) for filtering red and a portion (CF2) for filtering green may be disposed at an upper side of the first phosphor portion 1081 and the second phosphor portion 1082, and a portion (CF3) for filtering blue may be disposed to cover the light transmitting material 1083 at a portion forming a blue pixel. A black matrix (BM) may be disposed between the filtering portions (CF1, CF2, CF3).

As described above, in this example, the conversion layer 1080, the partition wall 1084, and the color filter (CF) may be combined to implement red, green, and blue unit pixels.

The sub-pixels implemented by the above structure are supported by the support substrate 1090.

According to the illustration, the support substrate 1090 includes a first region 1091, a second region 1092, and a third region 1093 in which a first semiconductor light emitting device 1051, a second semiconductor light emitting device 1052 and a third semiconductor light emitting device 1053 are disposed. In this case, the first region 1091, the second region 1092, and the third region 1093 may be regions having different sizes. More specifically, the first region 1091, the second region 1092, and the third region 1093 may be regions corresponding to the red sub-pixel, the green sub-pixel, and the blue sub-pixel, respectively. Therefore, the boundaries of the first region 1091, the second region 1092, and the third region 1093 may be set by the partition wall 1084.

The support substrate 1090 is formed of a silicon material, and a through silicon via (TSV) is formed on the support substrate 1090.

The through silicon via (TSV) may be formed by filling a via hole with a conductive material. As described above, the support substrate 1090 having the through silicon via (TSV) may be used, thereby facilitating one-to-one transfer at a wafer level.

More specifically, since the support substrate 1090 is an etchable silicon substrate, a through silicon via (TSV) may be formed by the etching. The through silicon via (TSV) passes through the support substrate 1090 at a position overlapping with the semiconductor light emitting device.

A plurality of through silicon vias (TSV) may be provided to correspond to the respective semiconductor light emitting devices. A first through silicon via (TSV1), a second through silicon via (TSV2), and a third through silicon via (TSV3) may be formed to correspond to the first semiconductor light emitting device 1051, the second semiconductor light emitting device 1052, and the third semiconductor light emitting device 1053. In this case, the first through silicon via (TSV1), the second through silicon via (TSV2) and the third through silicon via (TSV3) may be electrically connected to the second conductive electrodes of the first semiconductor light emitting device 1051, the second semiconductor light emitting device 1052, and the third semiconductor light emitting device 1053, respectively. For the connection, an electrode pad 1094 may be disposed on one side of the support substrate to cover the first through silicon via (TSV1), the second through silicon via (TSV2), and the third through silicon via (TSV3).

On the other hand, a fourth through silicon via (TSV4) electrically connected to the first conductive electrodes of the first semiconductor light emitting device 1051, the second semiconductor light emitting device 1052, and the third semiconductor light emitting device 1053 may be formed on the support substrate. For example, a common electrode 1095 connected to the first conductive electrodes of the plurality of semiconductor light emitting devices, respectively, may be formed on the support substrate 1090.

As the common electrode 1095 is extended to the fourth through silicon via (TSV4), the first conductive electrodes of the first semiconductor light emitting device 1051, the second semiconductor light emitting device 1052 and the third semiconductor light emitting device 1053 are electrically connected to the other side of the support substrate with the fourth through silicon via (TSV4) as a common through silicon via. A lower electrode 1096 may be respectively disposed below the first through silicon via (TSV1), the second through silicon via (TSV2), the third through silicon via (TSV3), and the fourth through silicon via (TSV4).

According to the above-described structure, the through silicon vias are provided with one through silicon via (TSV4) connected to the common electrode, and a plurality of through silicon vias connected to the second conductive electrodes of the plurality of semiconductor light emitting devices, (TSV1, TSV2, TSV3), respectively.

On the other hand, according to the illustration, the plurality of semiconductor light emitting device packages may respectively include an insulating layer 1086 covering the plurality of semiconductor light emitting devices at an opposite side of the conversion layer 1080 with respect to the plurality of semiconductor light emitting devices.

The insulating layer 1086 is formed as an underfill layer to fill between the semiconductor light emitting devices, and formed on one surface of the support substrate 1090 to adhere the semiconductor light emitting device to the support substrate. For the purpose of this, the insulating layer 1086 may be formed of a material having adhesiveness in addition to insulation.

In addition, the insulating layer 1086 may be formed of a material having high light reflectivity to remove optical interference between individual devices and enhance light extraction. However, the present disclosure is not necessarily limited thereto. For example, the insulating layer 1086 may include resin and reflective particles. The resin may be layered on the support substrate to fill between the plurality of semiconductor light emitting devices, and the reflective particles may be mixed into the resin.

In this case, the resin may include at least one of acrylic, epoxy, polyimide, a coating mixture of polymers, or a photoresist. The reflective particles may include at least one of titanium oxide, alumina, magnesium oxide, antimony oxide, zirconium oxide, and silica. On the other hand, the reflective particles may be a white pigment.

According to the structure described above, the semiconductor light emitting device package forms a pixel using the support substrate 1090 as a unit substrate. In other words, the semiconductor light emitting device package 1050 may be cut by dicing or the like on a wafer, and moved to the wiring substrate 1010 by pick-and-place or the like.

For example, a low melting point portion 1097 made of a material having a lower melting point than the wiring electrodes 1020, 1040 of the wiring substrate 1010 is formed between the wiring substrate 1010 and the semiconductor light emitting device package 1050. As a specific example, a low-melting point portion 1097 is disposed between the wiring electrodes 1020, 1040 of the wiring substrate 1010 and the lower electrode 1096 of the support substrate 1090 to implement electrical coupling. However, the present disclosure is not necessarily limited thereto, and the low melting point portion 1097 may be formed to surround the wiring electrodes and the conductive electrodes of the plurality of semiconductor light emitting devices, respectively.

For such an example, the low melting point portion 1097 may be plated on the wiring electrode with a solder material. The solder material may be at least one of Sb, Pd, Ag, Au and Bi, for example. In this case, solder may be deposited on the wiring electrode, and soldering may be carried out using thermal energy.

According to the illustration, the wiring substrate 1010 may have a larger area than that of the supporting board 1090. A plurality of support substrates may be arranged on the wiring substrate 1010 at preset intervals, thereby implementing a display device. A vacant space may be formed between the semiconductor light emitting device packages as illustrated in the drawings, but the present disclosure is not necessarily limited thereto. For example, the vacant space may be filled with an insulating material or the like or the unit substrates may be disposed to be brought into contact with each other without having the vacant space.

According to the above-described structure, a display device capable of controlling a drive current of each sub-pixel in the same manner may be implemented using a semiconductor light emitting device package distinguished as individual pixels on a wafer illustrated in this example. Meanwhile, the display device may be fabricated by a new method.

Hereinafter, a fabrication method applied to the present disclosure will be described with reference to the drawings.

FIGS. 15A through 15D and FIGS. 16A through 16E are conceptual views illustrating a fabrication method of a display device in FIG. 10.

Figure 15A:
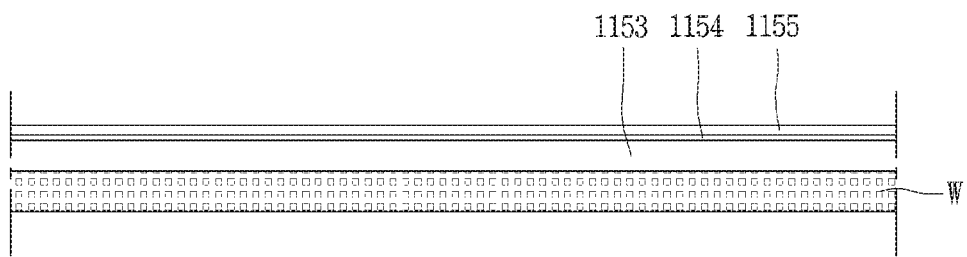
FIGS. 15A through 15D and FIGS. 16A through 16E are conceptual views illustrating a fabrication method of a display device in FIG. 10.

First, according to the fabrication method, an n-type semiconductor layer 1153, an active layer 1154, and a p-type semiconductor layer 1155 are respectively grown on a growth substrate (FIG. 15A).

The growth substrate (W) as a substrate on which the semiconductor light emitting device is grown may be a sapphire substrate. Furthermore, the growth substrate may use a SiC substrate having high thermal conductivity, or at least one of GaAs, GaP, InP, and $Ga_2O_3$ as a carrier wafer suitable for semiconductor material growth.

When the n-type semiconductor layer 1153 is grown, the active layer 1154 is then grown on the n-type semiconductor layer 1153, and the p-type semiconductor layer 1155 is then grown on the active layer 1154. Each semiconductor layer may include gallium nitride. Here, prior to the growth of the n-type semiconductor layer 1153, the undoped semiconductor layer may be first grown.

When the undoped semiconductor layer, the n-type semiconductor layer 1153, the active layer 1154 and the p-type semiconductor layer 1155 are sequentially grown as described above, a layered structure of micro semiconductor light emitting devices is formed as illustrated in FIG. 15A. In this example, a semiconductor may be grown as a layered structure of a blue semiconductor light emitting device.

The layered structure of the micro semiconductor light emitting device as a gallium nitride thin layer is comprised of various layers such as n-GaN, p-GaN, AlGaN, and InGaN. In this case, if the layered structure is grown without any problem in driving it as a light source, the composition, material, and thickness of the thin layer are suitably selected according to the purpose.

Figure 15B:
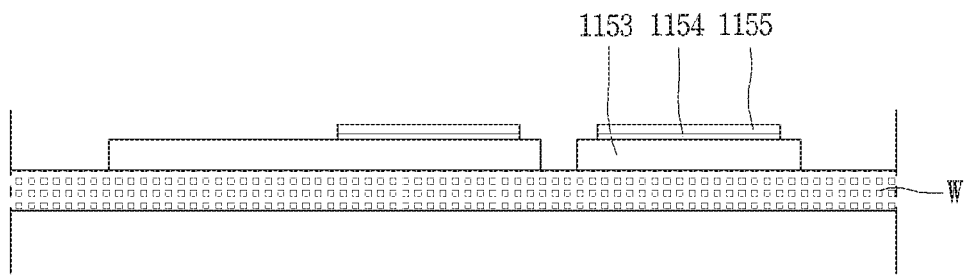

Next, at least part of the active layer 1154 and the p-type semiconductor layer 1155 are removed to expose at least part of the n-type semiconductor layer 1153 (FIG. 15B).

More specifically, the formed gallium nitride thin layer is etched, passivated, or the like to form a structure of a unit light emitting diode having a size of several to several hundreds of micrometers. The unit structure may constitute one pixel or one sub-pixel. The present embodiment illustrates one pixel structure, in which three subpixels constitute one pixel.

In this case, the active layer 1154 and the p-type semiconductor layer 1155 are partly removed in a vertical direction, and the n-type semiconductor layer 1153 is exposed to the outside. Through this, a mesa process of a plurality of light emitting devices is carried out. The active layer 1154 becomes a light emitting portion of the semiconductor light emitting device by the mesa process, and according to this example, the active layer 1154 and the p-type semiconductor layer 1155 are etched to form semiconductor light emitting devices having different light emitting areas at three positions. The detailed structure of the semiconductor light emitting devices having different light emitting areas will be described with reference to FIGS. 10 through 14.

Then, the n-type semiconductor layer 1153 and the undoped semiconductor layer are etched to isolate a plurality of light emitting devices so as to form a light emitting device array. In this manner, the p-type semiconductor layer 1155, the active layer 1154, the n-type semiconductor layer 1153, and the undoped semiconductor layer are etched to form a plurality of micro semiconductor light emitting devices.

At least one of the plurality of semiconductor light emitting devices formed on the growth substrate (W) has a different light emitting area from the other semiconductor light emitting devices through the mesa and the isolation.

Figure 15C:
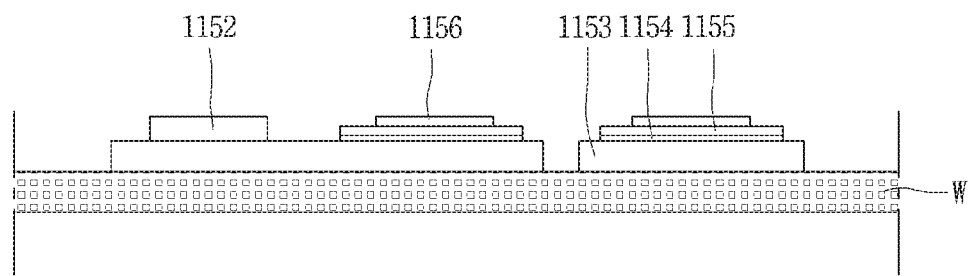

Next, electrodes are formed on the plurality of semiconductor light emitting devices to implement a flip chip type light emitting device. For example, an n-type electrode 1152 and a p-type electrode 1156 (refer to FIG. 11) are formed on the n-type semiconductor layer 1153 and the p-type semiconductor layer 1155, respectively (FIG. 15C).

The n-type electrode 1152 and the p-type electrode 1156 may be formed by a deposition process such as sputtering, but the present disclosure is not necessarily limited thereto. Here, the n-type electrode 1152 may be the foregoing second conductive electrode, and the p-type electrode 1156 may be the first conductive electrode.

Figure 15D:
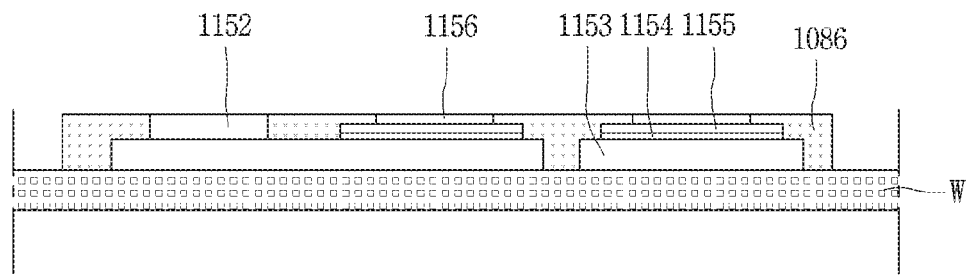

Next, an insulating layer 1086 for filling between the semiconductor light emitting devices is formed on one surface of the growth substrate (W) (FIG. 15D).

The insulating layer 1086 is formed as an underfill layer to fill between the semiconductor light emitting devices, and the semiconductor light emitting devices are adhered to the support substrate 1090.

Figure 16A:
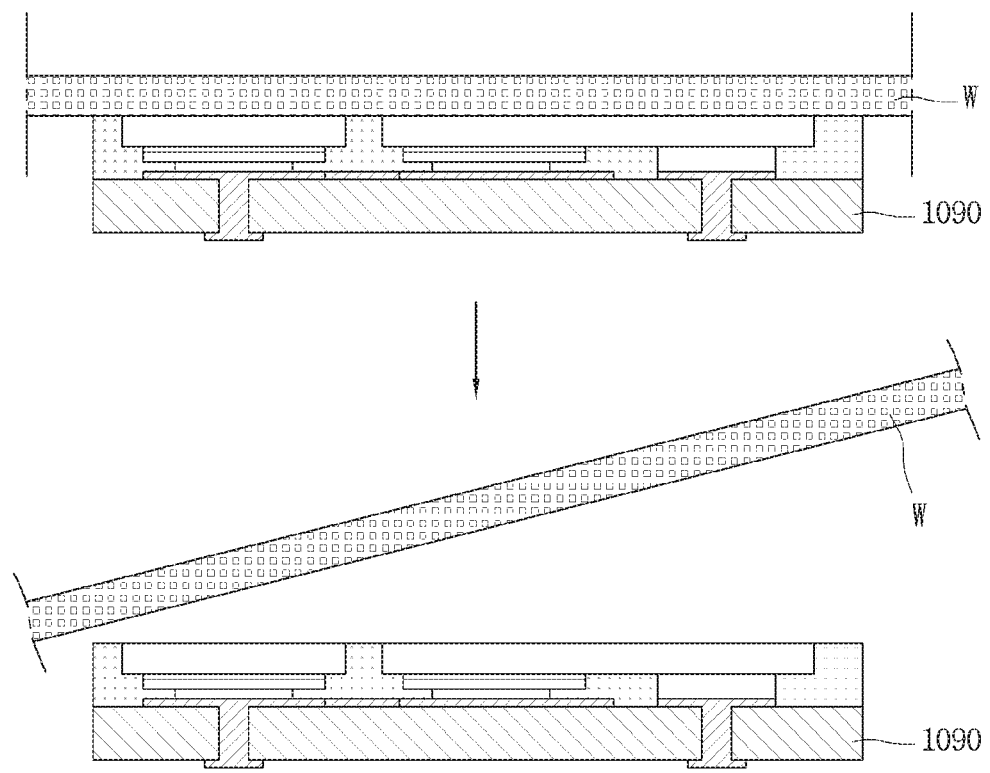

When a basic structure is completed by the above-described process, adhesion to the support substrate 1090 is carried out. In other words, the plurality of semiconductor light emitting devices are coupled to the support substrate 1090, and the growth substrate W is removed (FIG. 16A).

Adhesion is carried out using temperature, pressure, or a mixture of the two, or an adhesive material. After the adhesion is completed, the growth substrate (W) is removed. At this time, the growth substrate (W) may be removed using a laser lift-off (LLO) process or chemical lift-off (CLO) process. Alternatively, it may be possible to use mechanical polishing or the like, and also to use a mixture of the above-described processes. The plurality of semiconductor light emitting devices may include a plurality of semiconductor light emitting devices 1051, 1052, 1053 (refer to FIG. 10). In this case, the blue first semiconductor light emitting device 1051, the second semiconductor light emitting device 1052, and the third semiconductor light emitting device 1053 may be packaged on a wafer in the unit of pixels.

Next, a conversion layer 1080 for converting the color of light emitted from at least part of the plurality of semiconductor light emitting devices is formed.

Figure 16B:
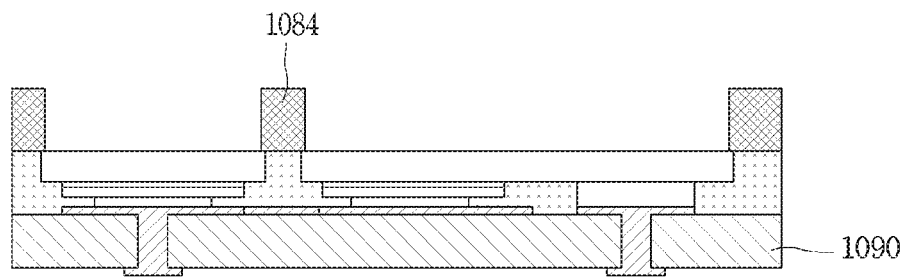

First, partitioning work for functional separation of each chip and color implementation of sub-pixels is carried out (FIG. 16B). The partition wall 1084 is formed in a manner of clearly distinguishing a sub-pixel region, and various materials capable of implementing a shape such as photoresist, optical polymer materials, and other industrial plastic materials may be used. The detailed structure of the partition wall 1084 will be substituted by the earlier description with reference to FIGS. 10 and 14.

Figure 16C:
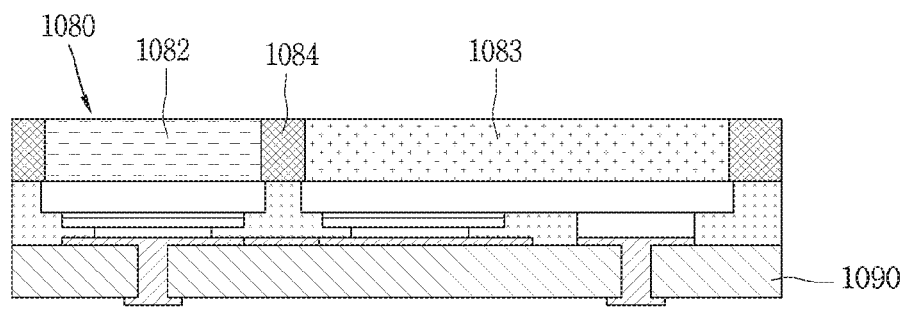

When the formation of partition walls is completed, a phosphor coating process is carried out (FIG. 16C). The coating of the phosphor is carried out by filling a space formed between the partition walls 1084 with the phosphor. The phosphors may be filled by various means such as bar coating, spray coating or the like, and collectively filled or selectively filled depending on the type of the phosphor. When the filling process is completed, the conversion layer 1080 is formed as illustrated in FIG. 10, and the detailed structure thereof will be substituted by the earlier description with reference to FIGS. 10 and 14.

Figure 16D:
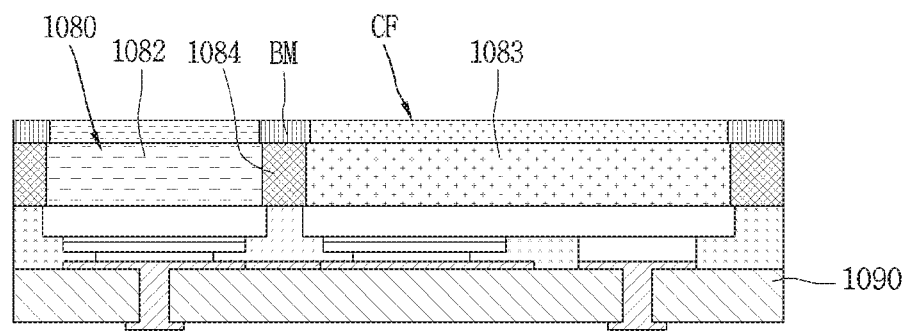

Next, a color filter (CF) for filtering light emitted from the phosphor is adhered to one surface of the conversion layer 1080 (FIG. 16D).

An additional adhesive layer may be provided for the adhesion of the color filter (CF), and the adhesive layer may include OCA, OCR, or the like.

In this case, the color filter (CF) is made to selectively transmit light to implement red, green and blue colors. In this case, the wavelength conversion material 1080 and the color filter (CF) are combined to implement red, green, and blue sub-pixels.

The color filter (CF) may be applied to enhance the color quality of the display and remove residual blue light. In this case, the color filter (CF) may be selectively applied if color implementation subsequent to the phosphor conversion is sufficiently accurate. In addition, a black matrix (BM) may be covered at portions other than the portion where the color filter (CF) is formed. The black matrix (BM) allows a higher quality display to have a higher contrast ratio.

The RGB pixels for display based on the fabricated ultra-small blue semiconductor light emitting device are individually divided and adhered to a PCB or target substrate to implement a display.

Figure 16E:
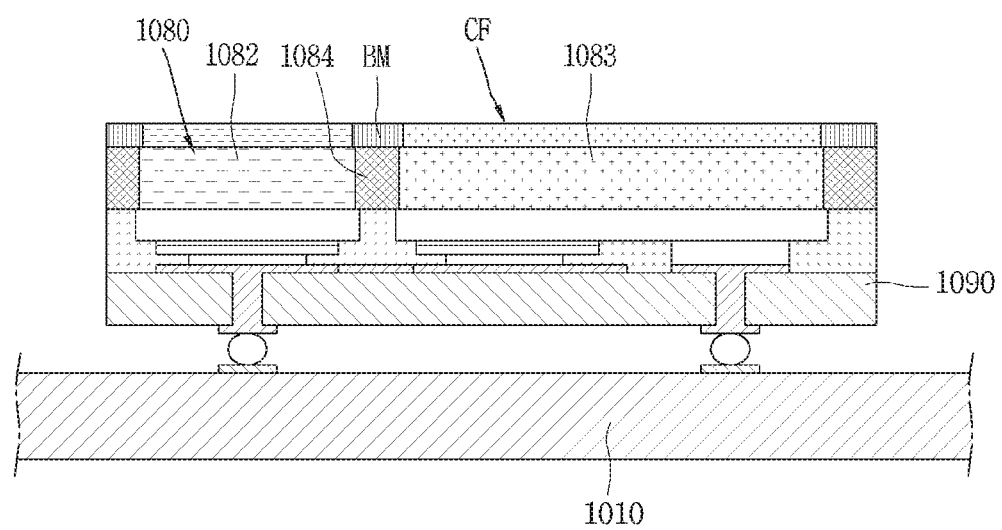

Specifically, the support substrate is prepared as a plurality of unit substrates, and the unit substrates are coupled to the wiring substrate 1010 at preset intervals (FIG. 16E).

A PCB may be typically used for the wiring substrate 1010, but the wiring substrate 1010 may be a flexible PCB or other substrate, which may be selected for the purpose of implementation. In this case, various methods such as pick and place, self assembly and solder reflow may be used for the adhesion process. For another example, in the display device described above, the semiconductor light emitting device package may be adhered to the wiring substrate by a conductive adhesive layer instead of the metal soldering.

In this example, a solder bump is formed on the wiring substrate 1010 and adhered thereto using a pick-and-place process. When the process is completed, the fabrication is completed as illustrated in FIG. 16E. Finally, a plurality of devices are arranged and integrated on the wiring substrate 1010 to implement a display.

According to the foregoing structure, a large-area display device may be implemented using a semiconductor light emitting device package distinguished as individual pixels on a wafer as illustrated in this example.

The configurations and methods according to the above-described embodiments will not be applicable in a limited way to the foregoing display device using a semiconductor light emitting device, and all or part of each embodiment may be selectively combined and configured to make various modifications thereto.

What is claimed is:
1. A display device, comprising:
  a plurality of semiconductor light emitting device packages;
  a wiring substrate coupled to the plurality of semiconductor light emitting device packages; and a plurality of wiring electrodes disposed on the wiring substrate, wherein each of the plurality of semiconductor light emitting device packages comprises:

a plurality of semiconductor light emitting devices;

a support substrate coupled to the plurality of semiconductor light emitting devices; and a conversion layer disposed to cover the plurality of semiconductor light emitting devices and configured to convert a color of light emitted from at least some of the plurality of semiconductor light emitting devices to a different color such that a red sub-pixel, a green sub-pixel, and a blue sub-pixel are formed, and wherein:

at least a first semiconductor light emitting device that corresponds to the red sub-pixel or a second semiconductor light emitting device that corresponds to the green sub-pixel, among the plurality of semiconductor light emitting devices, has a light emitting area that has a different size compared to a size of a light emitting area of a third semiconductor light emitting device that corresponds to the blue sub-pixel among the plurality of semiconductor light emitting devices;

the support substrate is formed of a silicon material, and a plurality of through silicon vias are formed on the support substrate;

at least one through silicon via of the plurality of through silicon vias is electrically connected to first conductive electrodes of the plurality of semiconductor light emitting devices; and other through silicon vias of the plurality of through silicon vias, except for the at least one through silicon via, are electrically connected to second conductive electrodes of the plurality of semiconductor light emitting devices.

2. The display device of claim 1, wherein the plurality of semiconductor light emitting devices comprise a first semiconductor light emitting device, a second semiconductor light emitting device, and a third semiconductor light emitting device that are coupled to the support substrate to form one semiconductor light emitting device package.

3. The display device of claim 2, wherein the first semiconductor light emitting device disposed at the red sub-pixel, the second semiconductor light emitting device disposed at the green sub-pixel, and the third semiconductor light emitting device disposed at the blue sub-pixel have different sizes.

4. The display device of claim 3, wherein:

the support substrate comprises a first region corresponding to the first semiconductor light emitting device, a second region corresponding to the second semiconductor light emitting device, and a third region corresponding to the third semiconductor light emitting device; and the first region, the second region, and the third region are different from one another in their sizes.

5. The display device of claim 2, wherein the first semiconductor light emitting device, the second semiconductor light emitting device, and third semiconductor light emitting device are blue semiconductor light emitting devices having different light emitting areas.

6. The display device of claim 1, wherein each of the plurality of semiconductor light emitting devices comprises:

a first conductive electrode and a second conductive electrode;

a first conductive semiconductor layer and a second conductive semiconductor layer formed with the first conductive electrode and the second conductive electrode, respectively; and an active layer formed between the first conductive semiconductor layer and the second conductive semiconductor layer.

7. The display device of claim 6, wherein a first conductive semiconductor layer of one of the plurality of semiconductor light emitting devices has a shape that is different from a shape of another first conductive semiconductor layer of another one of the plurality of semiconductor light emitting devices.

8. The display device of claim 7, wherein a first conductive semiconductor layer of a semiconductor light emitting device corresponding to the red sub-pixel is formed in a shape of extending in both directions that are perpendicular to each other.

9. The display device of claim 7, wherein a second conductive semiconductor layer of one of the plurality of semiconductor light emitting devices has a different upper surface area compared to an upper surface area of another second conductive semiconductor layer of another one of the plurality of semiconductor light emitting devices.

10. The display device of claim 1, further comprising a common electrode connected to a corresponding first conductive electrode of the plurality of semiconductor light emitting devices, wherein the common electrode is formed on the support substrate.

11. The display device of claim 10, wherein the through silicon vias are provided with one through electrode connected to the common electrode and a plurality of through electrodes connected to corresponding second conductive electrodes of the plurality of semiconductor light emitting devices.

12. The display device of claim 1, wherein each of the plurality of semiconductor light emitting device packages is provided with an insulating layer filling between the plurality of semiconductor light emitting devices.

13. The display device of claim 1, wherein:

each of the plurality of semiconductor light emitting device packages is provided with a partition wall; and the partition wall is provided with:

an edge portion formed along an edge of a corresponding one of the plurality of semiconductor light emitting device packages; and a partition portion protruded from the edge portion to partition between the red sub-pixel, the green sub-pixel, and the blue sub-pixel.

14. The display device of claim 13, wherein the partition portion has a first portion extended in one direction and a second portion protruded in another direction that is perpendicular to the one direction.

15. A semiconductor light emitting device package, comprising:

a plurality of semiconductor light emitting devices;

a support substrate coupled to the plurality of semiconductor light emitting devices; and a conversion layer disposed to cover the plurality of semiconductor light emitting devices and configured to convert a color of light emitted from at least some of the plurality of semiconductor light emitting devices to a different color such that a red sub-pixel, a green sub-pixel, and a blue sub-pixel are formed, and wherein:

at least a first semiconductor light emitting device that corresponds to the red sub-pixel or a second semiconductor light emitting device that corresponds to the green sub-pixel, among the plurality of semiconductor light emitting devices, has a light emitting area that has a different size compared to a size of a light emitting area of a third semiconductor light emitting device that corresponds to the blue sub-pixel among the plurality of semiconductor light emitting devices:

the support substrate is formed of a silicon material, and a plurality of through silicon vias are formed on the support substrate;

at least one through silicon via of the plurality of through silicon vias is electrically connected to first conductive electrodes of the plurality of semiconductor light emitting devices; and other through silicon vias of the plurality of through silicon vias, except for the at least one through silicon via, are electrically connected to second conductive electrodes of the plurality of semiconductor light emitting devices.

16. The semiconductor light emitting device package of claim 15, wherein the plurality of semiconductor light emitting devices comprises a first semiconductor light emitting device, a second semiconductor light emitting device, and a third semiconductor light emitting device that are coupled to the support substrate to form the semiconductor light emitting device package.

* * * * *